United States Patent [19]

Muething, Jr.

[11] Patent Number: 4,703,448
[45] Date of Patent: Oct. 27, 1987

[54] METHOD FOR MEASURING SKEW OR PHASE DIFFERENCE IN ELECTRONIC SYSTEMS

[75] Inventor: Gerald F. Muething, Jr., Pleasanton, Calif.

[73] Assignee: Nicolet Instrument Corporation, Madison, Wis.

[21] Appl. No.: 664,857

[22] Filed: Oct. 25, 1984

[51] Int. Cl.$^4$ ...................... G01R 25/08; H03D 13/00
[52] U.S. Cl. ................................. 364/481; 324/83 D; 307/525
[58] Field of Search ............... 364/481, 484, 486, 487; 324/82, 83 R, 78 D, 79 R, 79 D, 83 D; 328/133; 375/111, 118; 331/14, 25; 307/511, 525, 529; 318/608

[56] References Cited

U.S. PATENT DOCUMENTS

| | | | |
|---|---|---|---|
| 3,575,663 | 4/1971 | McIntosh | 375/111 |
| 3,681,693 | 8/1972 | Hsueh | 324/83 D |
| 3,764,903 | 10/1973 | Griswold | 324/83 D |
| 4,206,414 | 6/1980 | Chapman | 324/83 D |

Primary Examiner—Felix D. Gruber
Attorney, Agent, or Firm—Kinney & Lange

[57] ABSTRACT

A method for measuring channel-to-channel skew or phase difference in an electronic system of the type having a plurality of input channels which are sampled by sampling pulses having a frequency $f_o$ and a period $P_o$. The sampling pulses at each input channel are first mixed with a reference signal having a frequency $f_r$ and a period $P_r$ that differ from the frequency and period of the sampling pulses. The mixing produces a beat signal at each input channel. A quantity termed "effective measurement interval" which is equal to the difference of the periods of the sampling pulses, $P_o$, and the reference signal, $P_r$, is computed. A quantity termed "apparent skew" which is equal to the number of periods $P_o$ of the sampling pulses which represents the skew or phase difference between the beat signals is also determined. Finally, skew or phase difference of the sampling pulses is computed by multiplying the "effective measurement interval" by the "apparent skew".

7 Claims, 3 Drawing Figures

METHOD FOR MEASURING SKEW OR PHASE DIFFERENCE IN ELECTRONIC SYSTEMS

BACKGROUND OF THE INVENTION

1. Field of the Invention

The present invention relates to electronic signal processing and, particularly, to a method for determining skew or phase difference between digital signals.

2. Description of the Prior Art

Frequency and timing resolution in digital electronic systems are often limited by the rate at which the signals of interest can be sampled and converted into usable digital information. The uniform sampling theorem holds that a signal must be sampled at a frequency that is at least twice the maximum frequency of the components it is desired to resolve. Although this theorem defines the theoretical minimum sampling rate, errors introduced by other factors result in a practical limit which is somewhat higher than the theoretical limit.

Sampling rates have increased significantly in recent years and are projected to continue increasing. One error which is becoming more of a factor with the ever increasing sampling rates is known as channel-to-channel skew. Channel-to-channel skew is the phase difference with which the sampling pulses arrive at the system sampling points after propagation along different paths from an internal signal source. The amount of error introduced by channel-to-channel skew is dependent upon the magnitude of the skew in relation to the period of the sampling pulses. A 3 ns skew between sampling pulses having a period of 20 ns is, for example, relatively insignificant. In today's modern logic analyzer technology, however, sampling rates routinely exceed 200 MHz and are approaching 1000 MHz. At these rates, a 3 ns skew may equal or exceed the system's basic sample period. Measurement errors are a direct result.

Channel-to-channel skew is a product of a number of factors. As previously mentioned, the sampling pulses are typically generated by a common source and are propagated to the sampling points along different transmission paths. In theory, these pulses should propagate at the speed of light with imperceptible delay. However, physical and electrical properties of materials constrain this limit to some degree. Small variances in the lengths of cables or plating paths on circuit boards introduce different delays. Statistical tolerance variations in electronic components are another cause of delay.

To compound matters, signal transmission delays are not static and susceptible to complete correction through precision manufacturing. Temperature variations and component aging introduce slowly varying delays which drift over time.

From the above, it can be seen that channel-to-channel skew cannot be easily characterized. Although delays can be reduced through the use of low tolerance components and precise manufacturing techniques, the added production expense is prohibitive. This is particularly true in the case of sophisticated 64 input channel logic analyzers. However, the inherent skew of an instrument varies relatively slowly over time. Thus, a software compensation approach appears to be a more cost effective and accurate long term solution to the problem. If, prior to a test, channel-to-channel skew can be measured, a software compensation routine can be used to calibrate the system and reduce the errors attributable to skew.

It is, therefore, desirable to develop a method for measuring channel-to-channel skew in a digital electronic system. In order to be cost efficient, this method should be capable of being easily implemented by the software and hardware already present within the system. Also, the method should be capable of resolving skew to an accuracy of at least one order of a magnitude less than the period of the sampling pulses. Further, the method must be fast and repeatable.

SUMMARY OF THE INVENTION

The present invention is a method of measuring the skew or phase difference which exists between first digital signals having a frequency $f_o$ and a period $P_o$, at a plurality of measurement points. The method may be implemented by software and with the hardware already present within most digital electronic system. In addition, the method produces fast, accurate and repeatable measurements.

The first digital signals are first mixed, at their respective measurement points, with a digital reference signal having a frequency $f_r$ and a period $P_r$, the frequency $f_r$ and period $P_r$ being different from the frequency and period of the first digital signals. Beat signals are thereby produced at each measurement point, in known manner. A quantity called "effective measurement interval" and defined to be equal to the difference between the periods of the first signals, $P_o$, and the reference signal, $P_r$, is computed. A quantity called "apparent skew" is also determined. The apparent skew between the beat signal at one measurement point relative to the beat signal at another measurement point is defined to be equal to the number of periods $P_o$ of the first digital signals which represent the skew or phase difference between the beat signals at the respective measurement points. The skew of the sampling pulses is then computed by multiplying and effective measurement interval by the apparent skew.

In preferred embodiments, the first digital signals are sampling pulses generated by a sampling source within a logic analyzer. The method is used to calculate the skew or phase difference between the sampling pulses as they arrive at the logic analyzer input channel terminals.

DETAILED DESCRIPTION OF THE PREFERRED EMBODIMENTS

The present invention is a method by which the skew or phase difference between digital signals can be easily measured. The method is particularly advantageous when used in conjunction with a digital electronic system in which sampling pulses are generated by a common source and propagated along a plurality of transmission paths to particular sampling points. By using the method described herein, it is possible to make repeatable skew measurements that are accurate to at least an order of magnitude smaller than the period of the sampling pulses themselves. The method is well suited for measuring channel-to-channel skew in logic analyzers. Once known, it is relatively easy for internal software to compensate for the skew thereby increasing the accuracy of the logic analyzer.

Figure 1:
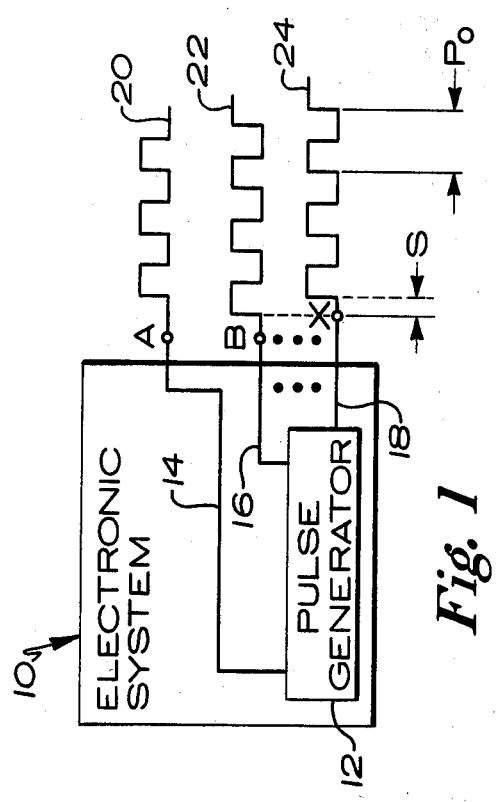
FIG. 1 is a block diagram of a digital electronic system illustrating the skew present between sampling pulses on different propagation paths.

An electronic system in which the method of the present invention can be used is illustrated generally in FIG. 1. Digital electronic system 10 may be any of a wide variety of electronic instruments including digital oscilloscopes and logic analyzers. A common feature of virtually all digital electronic systems is the need to sample signals thereby converting them into digital form for further processing. A digital oscilloscope, for instance, will receive at its inputs one or more analog or digital signals which the operator desires to analyze. These input signals are sampled at a high rate of speed and converted into a series of discrete values which are displayed and/or stored for further processing. A similar sampling procedure is performed on signals which are input to a logic analyzer.

Electronic system 10 will typically include pulse generator 12 for generating sampling pulses. In most high quality electronic systems, pulse generator 12 will be comprised of a high Q or SAW oscillator. Oscillators of this type exhibit a high degree of stability and low cycle-to-cycle "jitter". In a typical digital electronic system, all sampling pulses will be generated by a common pulse generator 12.

Although the sampling pulses may be propagated along a common transmission path for some distance, at some point it is necessary to split the signal and propagate the sampling pulses along separate transmission paths, illustrated in FIG. 1 as 14, 16, and 18. Transmission paths, 14, 16, and 18 end at sampling points A, B, and X, respectively. Although the sampling points A, B, and X are shown at the "front" end of the electronic system, it must be recognized that the method of the present invention can be used to measure the skew of the sampling pulses at any point within or without the electronic system. Also, while only three sampling points and transmission lines are shown in the Figures, it is to be understood that any number may be employed in the practice of the present invention.

As illustrated in FIG. 1, a train of sampling pulses 20, 22, and 24 will be present at sampling points A, B, and X after propagation along transmission paths 14, 16, and 18, respectively. The skew or phase difference between sampling pulses 22 and 24 is illustrated by the quantity S. Sampling pulses 20, 22, and 24 have a period $P_o$ and a frequency $f_o$.

Figure 2:
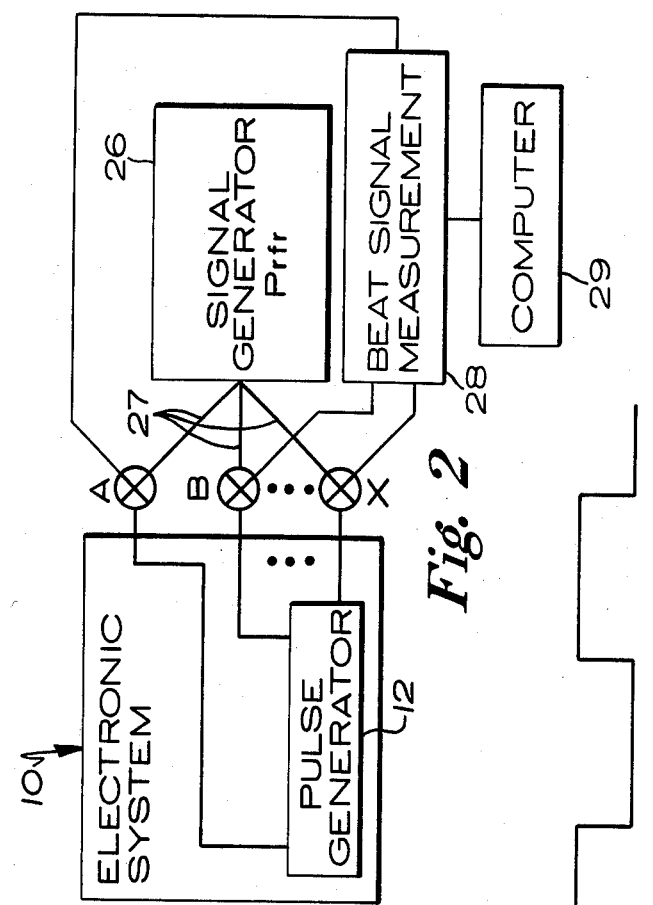
FIG. 2 is a block diagram of the instruments and interconnections used to implement the method of the present invention.

A technique for implementing the skew measurement is illustrated in FIG. 2. Sampling pulses 20, 22, and 24 are mixed at sampling points A, B, and X, respectively, with a digital reference signal having a period $P_r$ and a frequency $f_r$ which are different than the period and frequency of the sampling pulses. The reference signal is generated by a source such as signal generator 26. To ensure precise measurements, it is important that signal generator 26 generate a stable and accurate reference signal. High Q crystal controlled generators have been found to work well.

It is also important that the reference signal arrive at each sampling point A through X with minimal skew. In practice, this requirement is met by physically connecting all sampling points A through X to a low impedance output of signal generator 26. Signal paths 27 from signal generator 26 to sampling points A through X should also be kept to a minimum. An alternative technique would be to multiplex the signals normally input to sampling points A through X with the reference signal. Although this approach would be more desirable from a convenience standpoint, it can introduce error due to nonuniform and unmeasured variations in the signal path of the multiplexer.

As previously discussed, the frequency $f_r$ of the reference signal is different than the frequency $f_o$ of the sampling pulses. Frequency $f_r$ of the reference signal may be either greater or less than the frequency $f_o$ of the sampling pulses. In preferred embodiments, the difference between $f_o$ and $f_r$ is between 0.1 to 1 percent.

When the reference signal is sampled by the sampling pulses the two signals mix or "beat" to generate a beat signal at each sampling point A through X. The beat signals have a frequency $f_b$ which is equal to the difference between the frequencies $f_o$ of the sampling pulses and $f_r$ of the reference signal (i.e., $f_o - f_r$ for $f_o > f_r$ or $f_r - f_o$ for $f_r > f_o$). The beat signals also have a period $P_b$.

A term called "effective measurement interval" or "EMI" is defined to be equal to the difference between the periods $P_o$ of the sampling pulses and $P_r$ of the reference signal (i.e., $1/f_o - 1/f_r$ for $f_r > f_o$ or $1/f_r - 1/f_o$ for $f_o > f_r$). The effective measurement interval can be thought of as the amount by which the two frequencies "slip" past each other with each cycle or period of the reference signal. If, for example, $f_o = 10$ MHz and $f_r = 10.01$ MHz the EMI is found to be 0.1 nanoseconds.

Figure 3:
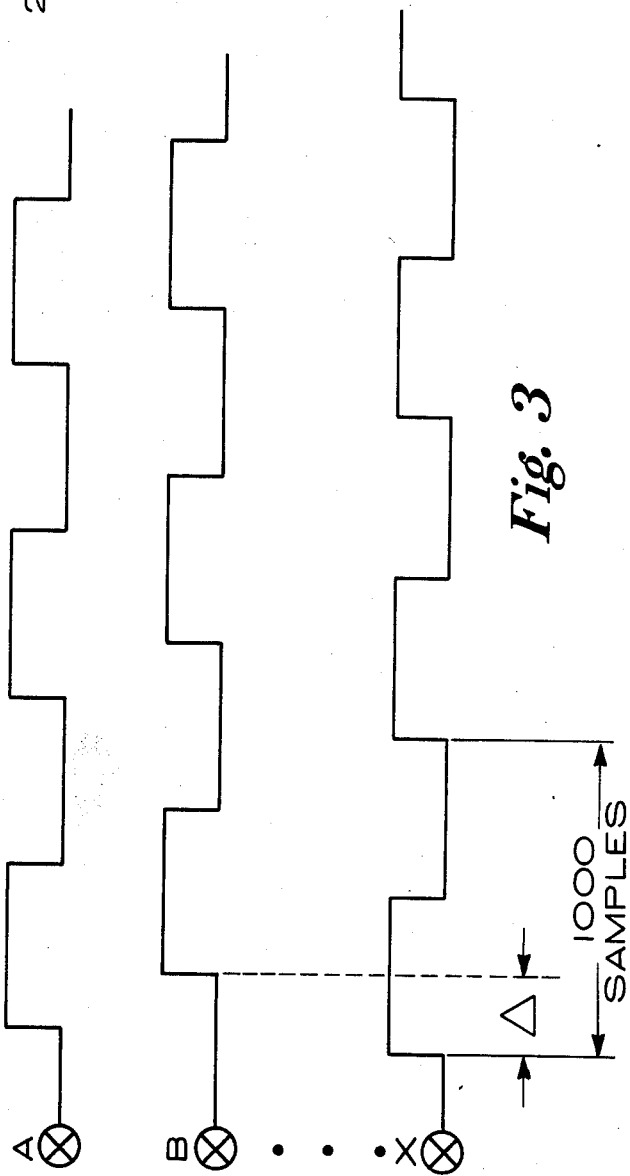
FIG. 3 is an illustration of the beat signals showing the apparent skew therein.

The beat signals generated at sampling points A, B and X are illustrated in FIG. 3 and measured, as described below, at best signal measurements 28 in FIG. 2. Unless the sampling pulses arrive at sampling points A through X with no skew or phase difference, the beat signals will be skewed from one another as is illustrated in FIG. 3. The skew between the beat signals is termed "apparent skew" and is a multiple of the actual skew present between sampling pulses at their respective sampling points. The skew of the beat signals can be thought of as a magnification of the sampling pulse skew. As shown in FIG. 3, the apparent skew between the beat signals at sampling points B and X is represented by the quantity delta ($\Delta$). For purposes of the method disclosed herein, "delta" or "$\Delta$" is defined to be equal to the number of periods $P_o$ of the sampling pulses which represents or is equal in time to the apparent skew of the beat signals. For example, if the edge discrepancy present between the beat signals at sampling points B and X was determined to be 22 samples or periods $P_o$, the apparent skew, or delta, would be equal to 22. This quantity can be directly measured at each of the sampling points as represented by the beat signal measurement 28.

The final step in the method of the present invention is to compute, as by computer 29 (FIG. 2), the actual skew present between the sampling pulses. Using the quantities defined above, skew is found to be equal to the product of the effective measurement interval and the apparent skew (i.e., SKEW = EMI $\times \Delta$). Using the figures given above as an example, skew is found to be 22 samples $\times$ 0.1 ns = 2.2 ns. Once the skew has been measured in accordance with the method described herein, it is relatively easy to develop software within the electronic system to compensate for these propagation delays and correct or compensate for errors introduced. Frequency and timing resolution of the digital electronic system are thereby enhanced.

The method of the present invention is particularly well suited for determining the channel-to-channel skew of a logic analyzer. Formulas which utilize parameters readily determined by the logic analyzer greatly simplify the software which must be included to implement the method. Although the parameters used in the formulas presented below are somewhat different than those previously used to describe the method, it must be appreciated that the formulas are equivalent and will produce identical results. These examples illustrate the fact that other parameters can be used to implement the method of the present invention.

Logic analyzers will typically include memory for storing sampled data. For purposes of illustration, a logic analyzer having a memory depth of at least 1000 samples is assumed in this description. Skew measurement is not, however, limited to any particular number.

An output of a signal generator is connected to all input channels of the logic analyzer from which it is desired to measure skew. If the number of channels is large, or if they have significant capacitive loading, a high speed, high drive buffer may be required. The signal generator is adjusted to produce a reference frequency $f_r$ which is fractionally different from the frequency of the sampling pulses. When this has been done, a trace on the logic analyzer screen will graphically display the beat signals from each sampling point A through X, as shown in FIG. 3. If necessary, the reference signal frequency $f_r$ should be adjusted so that 1000 samples can be collected over one full period $P_b$ of a beat signal. The logic analyzer is then set to trigger on the 0-to-1 transition of the beat signal from which skew of the other channels will be measured (sampling point X in FIG. 3). The 1000 samples are then collected at the other input channel, sampling point B, for example. The triggering and signal collecting are represented by beat signal measurement 28 of FIG. 2.

Software within the logic analyzer can easily be programmed to determine the apparent skew or $\Delta$ between the beat signal used as the trigger source (point X in FIG. 3) and the other beat signal for which samples were stored (point B in FIG. 3). This can, for example, be done by having the software program count the number of samples stored of the beat signal at point B from the triggering event to the next occurring 0-to-1 edge transition on the beat signal at point B. Once the apparent skew between two beat signals is determined (at beat signal measurement 28) in terms of the number of sampling pulses that occur therein, the skew between the sampling pulses at these sampling points is determined according to the following formulas:

$$SKEW = \frac{\text{PERIOD OF SAMPLING PULSES } (P_o)}{\text{NUMBER OF REFERENCE SIGNAL PERIODS } (P_r)/\text{BEAT SIGNAL}} \times \Delta$$

or alternatively $$SKEW = \frac{\text{PERIOD OF REFERENCE SIGNAL } (P_r)}{\text{NUMBER OF SAMPLING PULSE PERIODS } (P_o)/\text{BEAT SIGNAL}} \times \Delta$$

As is evident from the above formulas:

$$\frac{\text{PERIOD OF SAMPLING PULSES } (P_o)}{\text{NUMBER OF REFERENCE SIGNALS PERIODS } (P_r)/\text{BEAT SIGNAL}} \quad \&$$

$$\frac{\text{PERIOD OF REFERENCE SIGNAL } (P_r)}{\text{NUMBER OF SAMPLING PULSE PERIODS } (P_o)/\text{BEAT SIGNAL}}$$

are alternative ways of expressing the effective measurement interval EMI and each is the algebraic equivalent of EMI as first defined above. The actual computation of SKEW (as opposed to the counting performed at best signal measurement 28) may be performed at computer 29.

In summary, the present invention is a method for measuring the skew of phase difference between digital signals. The method is accurate and repeatable and is particularly well suited for use with logic analyzers. Although the present invention has been described with reference to preferred embodiments, workers skilled in the art will recognize that changes may be made in form and detail without departing from the spirit and scope of the invention.

What is claimed is:

1. In a digital electronic system in which sampling pulses having a frequency $f_o$ and a period $P_o$ are generated by a sampling source and propagated to a plurality of signal sampling points, a method for measuring the skew or phase difference between the sampling pulses as they arrive at the sample points, the method including the steps of:
   producing a reference signal having a period $P_r$ and a frequency $f_r$;
   beating the sampling pulses at each sampling point with said reference signal to produce a plurality of beat signals at each sampling point;
   determining, at least partially by measurement, the edge discrepancy between beat frequency signals in terms of the number of sampling pulses that occur therein;
   computing a quantity termed effective measurement interval which is equivalent to the difference of the period $P_o$ of the sampling pulses and the period $P_r$ of the reference signal; and
   computing the skew or phase difference by multiplying the number of sampling pulses representing the edge discrepancy by the effective measurement interval.

2. The method of claim 1 wherein the digital electronic system is a logic analyzer and the measurement points are input channel terminals.

3. A method for measuring channel-to-channel skew in a logic analyzer in which a plurality of input channels are sampled by sampling pulses having a frequency $f_o$ and a period $P_o$, the logic analyzer implementing steps including:
   generating a reference signal having a frequency $f_r$ and a period $P_r$ which are different than the frequency $f_o$ and the period $P_o$;
   mixing the reference signal and the sampling pulses at the input channels to form beat signals having a frequency $f_b$ equal to the difference between the frequency $f_o$ of the sampling pulses and the frequency $f_r$ of the reference signal and having a period $P_b$;
   determining, at least partially by measurement, a quantity called apparent skew which is the number of the sampling pulses which represents the skew or phase difference between the best signals;

computing a quantity called effective measurement interval which is equivalent to the difference between periods of the sampling pulses, $P_o$, and the reference signal, $P_r$; and computing the sampling pulse skew by multiplying the apparent skew by the effective measurement interval.

4. A method for measuring skew or phase difference between digital signals at a plurality of measurement points, the digital signals of said measurement points each having a frequency $f_o$ and a period $P_o$, the method including the steps of:

producing a reference signal having a period $P_r$ and a frequency $f_r$;

mixing the digital signals at said measurement points with said reference signal to produce a beat signal at each measurement point;

determining, at least partially by measurement, a quantity called apparent skew which is the number of periods $P_o$ of the digital signals at said measurement points which represent the skew or phase difference between the beat signals at one measurement point and the beat signals at a different measurement point;

computing a quantity called effective measurement interval which is equivalent to the difference between the periods $P_o$ and $P_r$; and computing the skew between the digital signals at said one and different measurement points by multiplying the effective measurement interval by the apparent skew.

5. The method of claim 4 wherein the step of determining includes the step of measuring the interval between a trigger event associated with the beat signal at said one measurement point and a trigger event associated with the beat signal at said different measurement point.

6. The method of claim 5 wherein the step of measuring includes the step of counting the digital signals occurring from one trigger event to the next trigger event.

7. The method of claim 4 wherein the digital signals are sampling pulses generated by a sampling source within a digital electronic system.

* * * * *